(12) United States Patent
Ko

(10) Patent No.: US 6,483,131 B1
(45) Date of Patent: Nov. 19, 2002

(54) HIGH DENSITY AND HIGH SPEED CELL ARRAY ARCHITECTURE

(75) Inventor: U-Ming Ko, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/738,015

(22) Filed: Dec. 14, 2000

Related U.S. Application Data

(60) Provisional application No. 60/175,553, filed on Jan. 11, 2000.

(51) Int. Cl.[7] .......................... H01L 27/10; H01L 21/82
(52) U.S. Cl. ...................... 257/204; 257/206; 257/778; 438/129
(58) Field of Search ................................ 257/335, 378, 257/375, 355, 336, 341, 499, 730, 678, 773, 788, 211, 204, 206, 208, 758, 750, 315, 716; 438/108, 120

(56) References Cited

U.S. PATENT DOCUMENTS 4,584,653 A * 4/1986 Chih et al. .................. 257/204
5,514,895 A * 5/1996 Kikushima et al. ......... 257/378

* cited by examiner

*Primary Examiner*—Olik Chaudhuri
*Assistant Examiner*—Yennhu B. Huynh
(74) *Attorney, Agent, or Firm*—Ronald O. Neerings; Wade James Brady, III; Frederick J. Telecky, Jr.

(57) ABSTRACT

The present invention provides an array of customizable functional cells having high density and high drive capacity. It further provides an architecture that maximizes the width of P-channel transistors in an array of standard cells to compensate for the lower speed operation of P-type devices. More particularly, the invention discloses a digital circuit comprising a plurality of inputs for receiving respective logic signal and circuitry, coupled to the inputs, for passing one of the signals responsive to the order in which a transition is received on each of the inputs.

24 Claims, 4 Drawing Sheets

HIGH DENSITY AND HIGH SPEED CELL ARRAY ARCHITECTURE

This application claims priority under 35 U.S.C. §119(e)(1) of provisional application Ser. No. 60/175,553, filed on Jan. 11, 2000.

BACKGROUND OF THE INVENTION

1. Technical Field

The present invention relates to the field of customized or application specific integrated circuits. More specifically, the present invention relates to an architecture for providing a customized application specific device having high functional density with high operational speed.

2. Description of the Related Art

There are many conflicting demands on manufacturers of application specific integrated circuits. Customers demand more complexity, but also demand faster development time. In integrated circuit design, the maximum layout density (and thus highest complexity per integrated circuit) is provided by wholly custom layouts. However, custom generation of integrated circuits is very time consuming. It is not possible to meet the customer's need for quick turn-around with custom layouts. To meet this need while providing good functional density, the use of arrays of standard cells has emerged as a useful architecture.

Standard cell arrays are generally arranged in rows having a fixed width. The cells may have varying length to provide the necessary cell functionality. For example, the simplest cells are inverters. In complementary metal oxide semiconductor (CMOS) designs, an inverter will have one N-channel and one P-channel transistor. In between the rows are routing areas for interconnecting the cells. Power leads may also run through the routing areas or may have designated areas overlying the cell areas. Standard cell arrays have been combined with powerful computerized design tools to provide high functional density with fast order turn-around time. An example of this type of device is the GS30 series provided by Texas Instruments.

However, the standard cell system provides inherent design compromises. To provide high density, an array may be laid out using the minimum row width. For example, a minimum width may be six squares. A square is normalized unit equal to the minimum feature size that can be formed on the integrated circuit. Six square rows provide a very dense array. However, after applying half of the row to P-type transistors and the other half to N-type, the maximum transistor width is about two squares (after including isolation structures between devices). A transistor this small does not provide adequate drive capacity to provide high-speed operation. On the other hand, providing wide rows for high drive transistors reduces the density of the array. The present invention solves this trade-off by providing an architecture that allows for high density and high drive transistors.

BRIEF SUMMARY OF THE INVENTION

It is an object of the present invention to provide an array of customizable functional cells having high density and high drive capacity.

It is a further object of the present invention to provide an architecture that maximizes the width of P-channel transistors in an array of standard cells to compensate for the lower speed operation of P-type devices.

These and other objects are provided by one embodiment of the present invention that includes an integrated circuit having a plurality of first circuit elements, the first circuit elements having a first width. These circuit elements are arranged in a plurality of rows in a semiconductor substrate. The integrated circuit also includes a plurality of second circuit elements having a width of twice the width of the first circuit elements. The second circuit elements are placed in the plurality of rows and occupy the width of two of the first circuit elements.

An additional embodiment of the present invention includes an integrated circuit comprising a plurality of first circuit elements having a first width. The first circuit elements are arranged in a plurality of rows having a plurality of rows in a semiconductor substrate. The rows are divided into a first area of a first conductivity type and a second area of a second conductivity type. The first and second areas alternate in at least two adjacent rows such that the first areas of the at least two adjacent rows are positioned adjacent to each other. The integrated circuit includes a plurality of second circuit elements having a width of twice the first circuit elements. The second circuit elements positioned in the plurality of rows and occupying the width of two of the first circuit elements. At least one of the second circuit elements spans two adjacent rows.

BRIEF DESCRIPTION OF THE DRAWINGS

For a more complete understanding of the present invention and the advantages thereof, reference should be made to the following Detailed Description taken in connection with the accompanying drawings in which.

DETAILED DESCRIPTION OF THE PREFERRED EMBODIMENT

Figure 1:
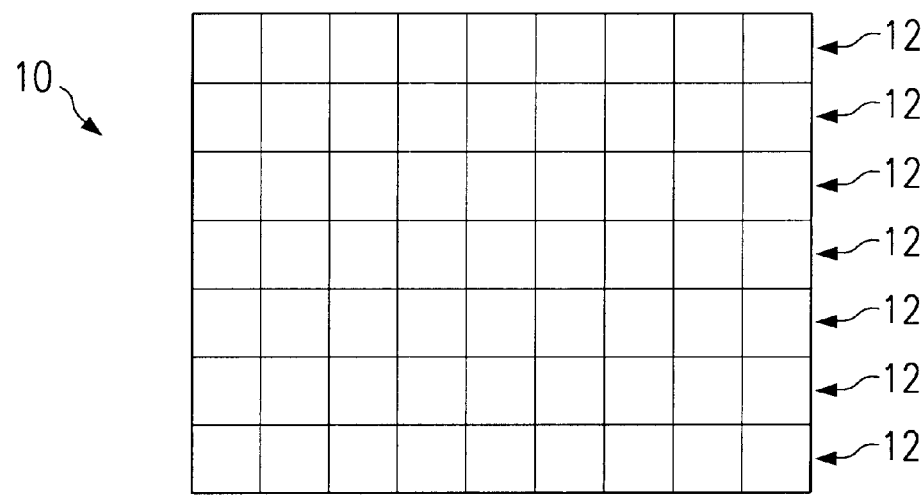
FIG. 1 is a layout diagram of a prior art array.
Figure 2:
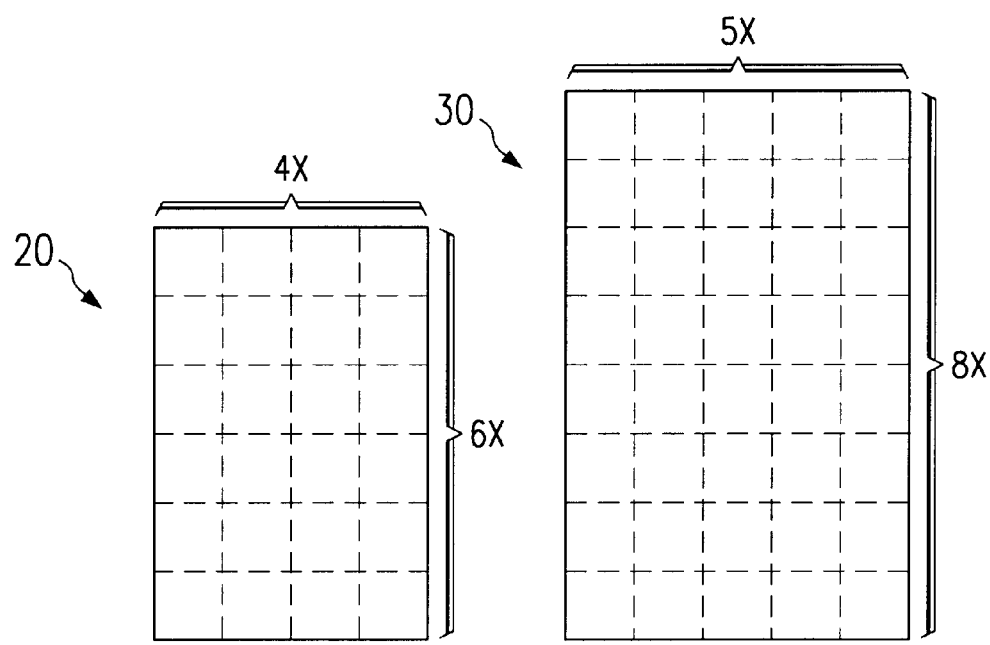
FIG. 2 is a layout diagram comparing two prior art cells from a standard cell array.

FIG. 1 is a layout diagram of a prior art cell array. Array 10 consists of a plurality of rows 12 for placement of circuit elements, often called standard cells. FIG. 2 is a layout diagram of example cells as used in the prior art. Cell 20 is designed for high density. The row width for an array including cell 20 is six squares. Cell 20 is shown with a length of four squares. However, cells used with cell 20 may have a number of lengths. Cell 30 is designed for a high speed array. Cell 30 has a width of eight squares with a length of five squares. In addition, cell 30 provides the same functionality as cell 20, but the transistors in cell 30 are wider. As is commonly used in the industry, transistor width is the surface dimension perpendicular to the flow of carriers in the transistor's channel region. A wider transistor has a greater current drive capability. Greater current drive capability allows cell 30 to operate faster than cell 20. However, an array including cell 30 will be larger for the same functionality or some functionality must be excluded if the arrays are the same size. The present invention avoids the need to compromise array size and array speed.

Figure 3:
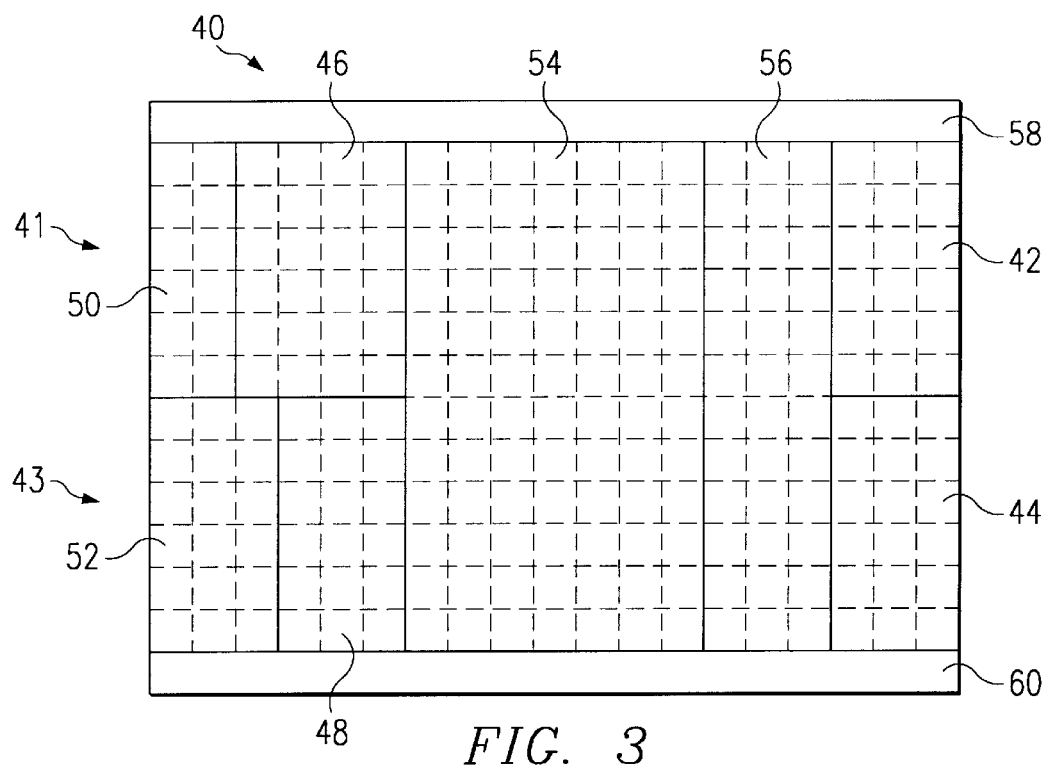
FIG. 3 is a layout diagram of a portion of a standard cell array that is one embodiment of the present invention.

FIG. 3 is a layout diagram of an array designed using the principles of the present invention. Array 40 is preferably a CMOS or Bipolar CMOS integrated circuit fabricated using a process such as that shown in Smayling et al., U.S. Pat. No. 5,767,551, which is assigned to the assignee of this application and which is hereby incorporated by reference. The portion of array 40 shown in FIG. 3 is two rows 41 and 43 of a standard cell array. The complete layout area of cells 42, 44, 46 and 48 are shown. In addition, a portion of cells 50 and 52 are shown. These cells are compact cells with a width of six squares. Routing areas 58 and 60 are provided for inter-cell routing of leads, including power ($V_{DD}$) and ground ($V_{SS}$) leads where appropriate.

Array 40 includes cells 54 and 56 with widths of twelve squares that span both rows 41 and 43. These cells are included in the array when high drive is needed to maintain circuit speed. For example, a cell may need to drive inputs to several other cells. If a low drive cell, such as cell 46, were used for this function, the lower drive current would require too much time to charge or discharge the inputs of downstream cells to the desired signal value. By using cells 54 and 56, high drive cells can be used when needed to maintain speed, but small cells (42, 44, 46, 48, 50 and 52) can be used for the majority of the array's functionality. This provides a high speed array with high density.

Figure 4:
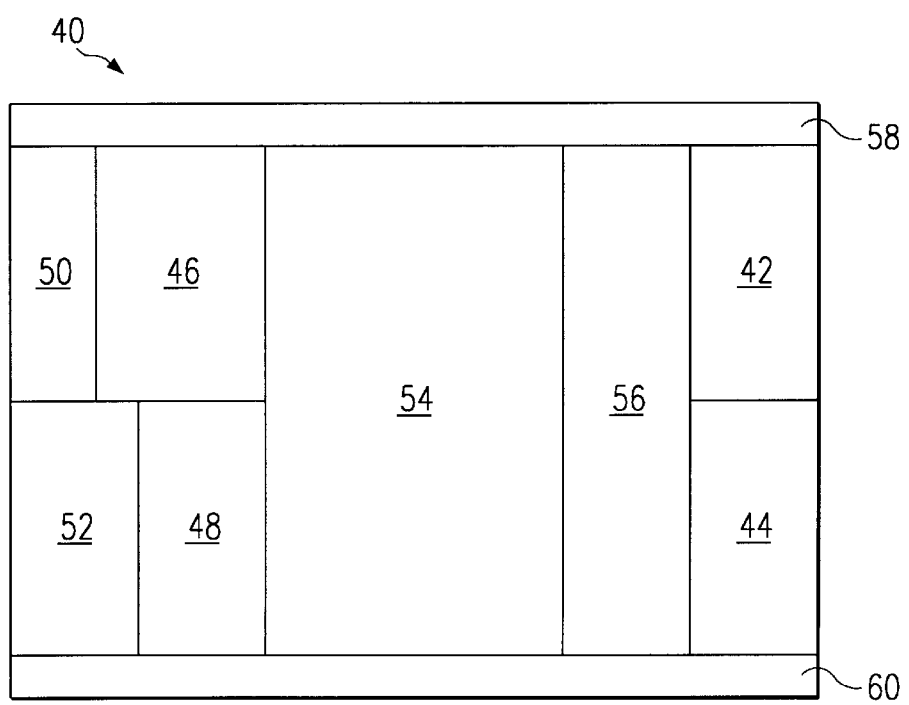
FIG. 4 is another view of FIG. 3 with the grid lines removed.
Figure 5:
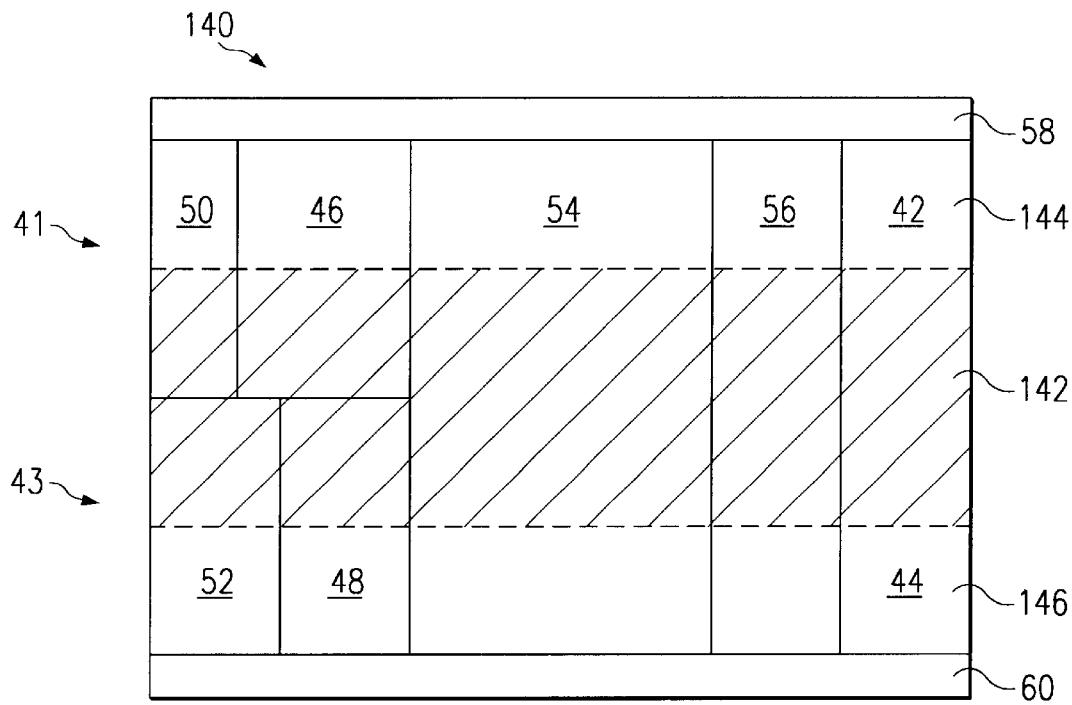
FIG. 5 is layout view of another embodiment of the present invention.

FIG. 4 is another view of array 40 with the grid lines removed to more clearly see the layout of the cells and the routing areas. FIG. 5 is a layout of an array 140, which is another embodiment of the present invention. Like numbered components in FIG. 5 provide the same function as those shown in FIG. 3. The embodiment of FIG. 5 includes N-well 142 that spans rows 41 and 43. In addition, P-well 144 is formed in row 41 and P-well 146 is formed in row 43. N-well 142 is for the formation of P-channel transistors in accordance with known fabrication techniques for making P-channel transistors such as those shown in Smayling et al.

N-well 142 is actually two N-wells formed adjacently. One for row 41 and one for row 43. Of importance, in cells 54 and 56, N-well 142 forms one contiguous area. This allows for the formation of transistors that include the full width of N-well 142 less the area needed for isolation from devices formed in P-wells 144 and 146. This structure allows cells 54 and 56 to have very wide P-channel transistors. As is well known in the art, P-channel transistors inherently have lower drive capability than N-channel transistors because holes are the primary carrier mechanism in P-channel transistors. Electrons are the primary carrier mechanism in N-channel devices. Holes are less mobile than electrons. Thus, an N-channel transistor will provide less drive current for the same transistor size, characteristics and drive voltages. The advantages of providing wide P-channel transistors in the embodiment of FIG. 5 will be explained more fully below.

Figure 6:
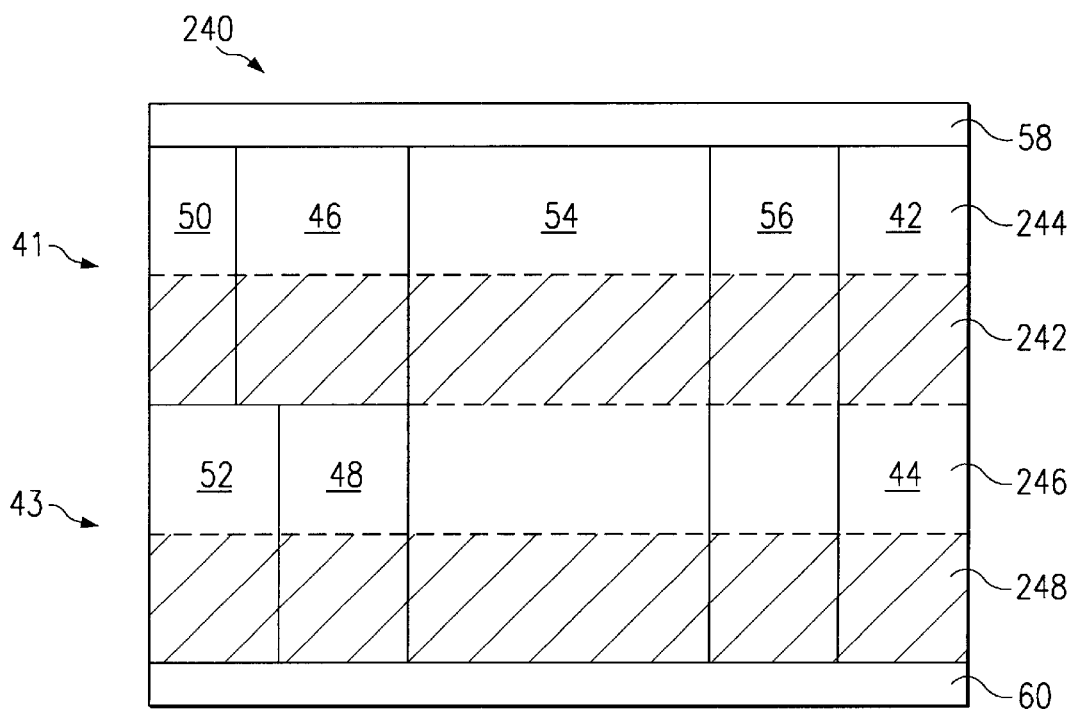
FIG. 6 is layout view of an additional embodiment of the present invention including.

FIG. 6 is a layout diagram of another embodiment of the present invention. Like numbered components in array 240 perform the same function as those of array 40. As with array 140 of FIG. 5, array 240 is designed for CMOS cells. N-well 242 provides an area for P-channel transistors in row 41. P-well 244 provides an area for N-channel transistors in row 41. N-well 248 provides an area for P-channel transistors in row 43. P-well 246 provides an area for N-channel transistors in row 43. Thus, complete CMOS cells can be formed in each row.

Figure 7:
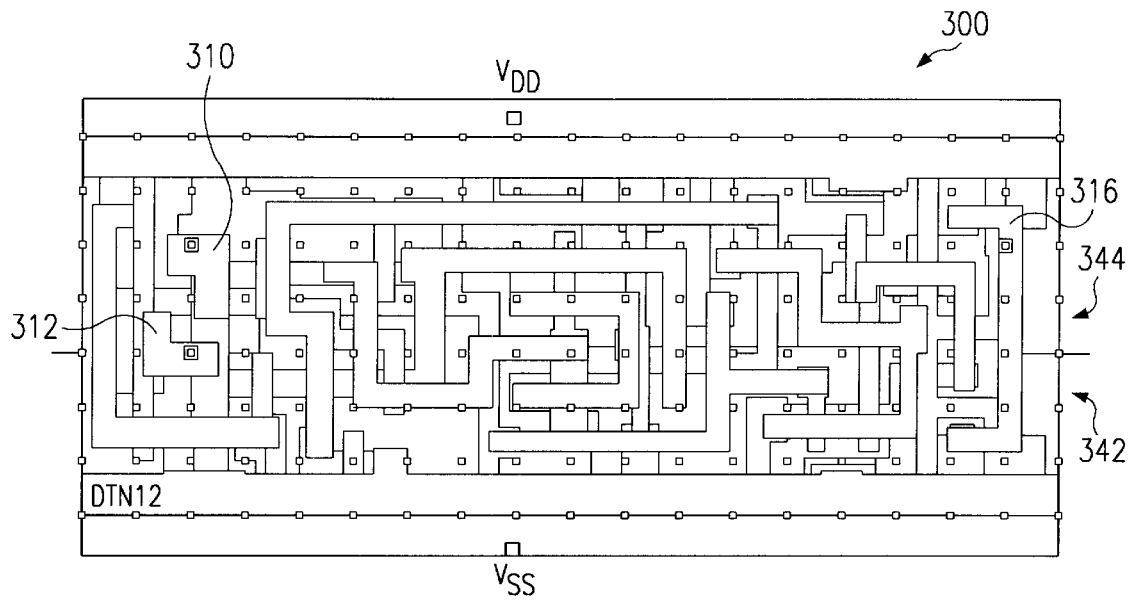
FIG. 7 is a layout of a standard cell suitable for use with the present invention.

FIG. 7 is a layout diagram of a D-type flip-flop cell 300 suitable for use with the present invention. Flip-flop 300 uses a row width of seven squares and is thus suitable for use in a single seven square row. $V_{DD}$ is provided in routing area 58. A ground bus overlying the border between rows provides $V_{SS}$. The D input signal is provided at terminal 310 and a clock signal is input at terminal 312 and an output on terminal 316 as the Q output. Area 344 is an N-well for P-channel transistors and area 342 is a P-well for N-channel transistors.

Figure 8:
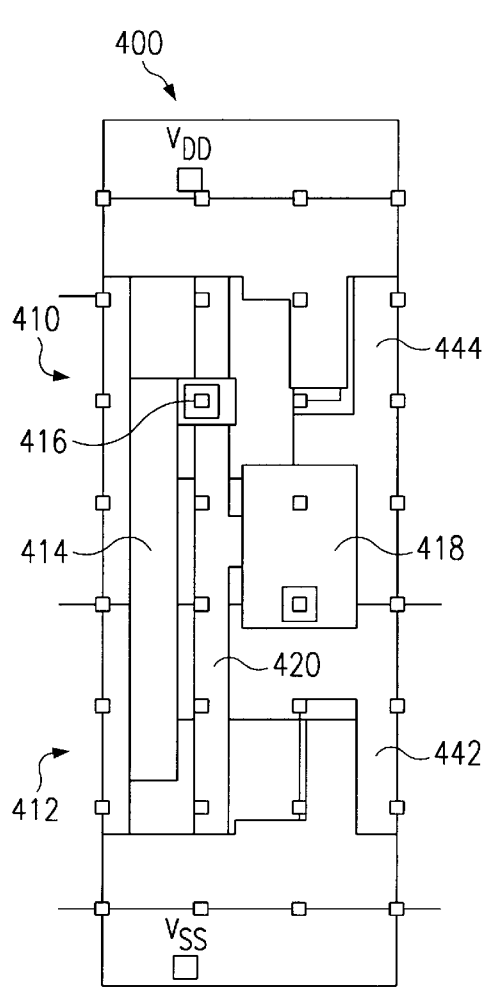
FIG. 8 is a layout of a another standard cell suitable for use with the present invention.

FIG. 8 is an inverter 400 suitable for use in one row in the present invention. The active components of inverter 400 are P-channel transistor 410 and N-channel transistor 412. P-channel transistor 410 is formed in N-well 444. N-channel transistor 412 is formed in P-well 442. $V_{DD}$ is provided to the source of transistor 410. $V_{SS}$ is provided to the source of transistor 412. The drains of transistors 410 and 412 are tied together using lead 414 and provided to output terminal 416. The input terminal 418 is tied to gate 420, which serves as the gate for both transistors 410 and 412.

Figure 9:
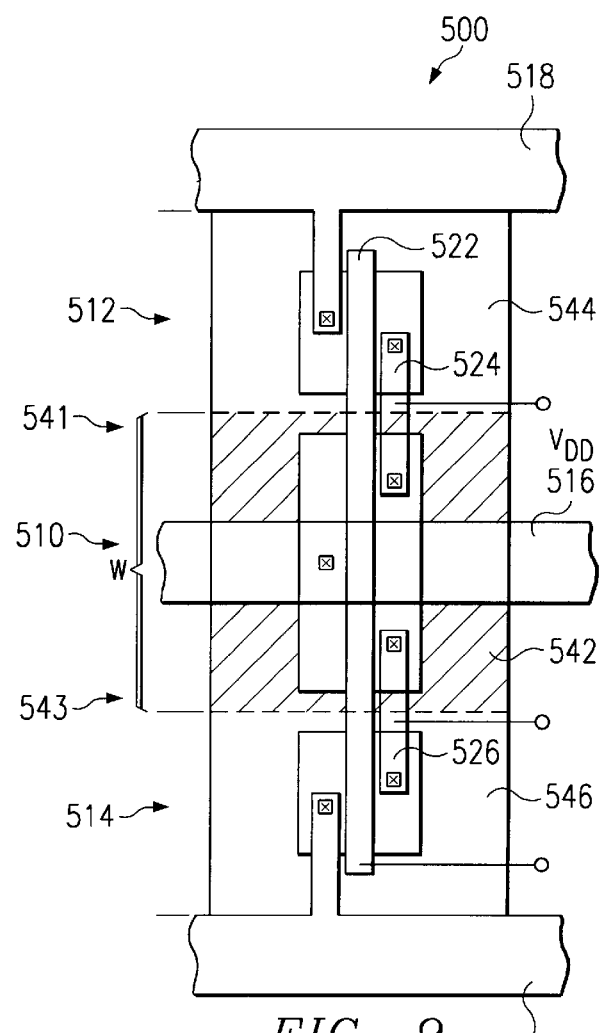
FIG. 9 is a layout view of a high drive cell suitable for use with the present invention.

In contrast to inverter 400, inverter 500 of FIG. 9 is high drive invertor suitable for use in a two row cell. The source of P-channel transistor 510 is connected to $V_{DD}$ via lead 516. Lead 516 is a common bus overlying the border of rows 541 and 543. The sources of transistors 512 and 514 are connected to $V_{ss}$ by leads 518 and 520, respectively. Gate 522 serves as a common gate for transistors 510, 512 and 514, and as and input terminal. The drains of transistors 510, 512 and 514 are tied together using leads 524 and 526, which serve as output terminals. In a preferred embodiment, leads 524 and 526 will be one lead formed in a multilevel metal system. P-channel transistor 510 is formed in N-well 542. N-channel transistors 512 and 514 are formed in P-wells 544 and 546, respectively. Of importance, the width W of P-channel transistor 510 is equal to the width of an entire row less the area used for isolation from transistors 512 and 514. This is more than twice the channel width of transistor 410 of FIG. 8 because there is no need for isolation between the two halves of transistor 510. On the other hand, transistor 410 must have isolation devices on both the top and bottom of its source and drain diffusions. Thus, the described embodiment of the present invention allows the use of selected transistors that are more than twice the width achievable using the prior art.

Although specific embodiments of the present invention are described herein, they are not to be construed as limiting the scope of the invention. For example, although specific circuits and device fabrication techniques are described and referred to herein, many specific devices and fabrication techniques may be advantageously used within the scope of the invention. Many embodiments of the invention will become apparent to those skilled in the art in light of the teachings of this specification. For example, although the described embodiments use adjacent N-well regions to provide wide P-channel transistors, the teachings of the invention may be used to provide wide N-channel transistors in adjacent P-well regions. As another example, although the described embodiments use CMOS transistors, the teachings of the invention may be advantageously applied to circuits using bipolar transistors or circuits using only P or N type transistors. The scope of the invention is only limited by the claims appended hereto.

Having thus described my invention, what I claim as new and desire to secure by letters patent is set forth in the following claims:

What is claimed is:

1. An integrated circuit comprising:
    a plurality of first circuit elements having a first width, the plurality of first circuit elements positioned in a plurality of rows in a semiconductor substrate; and
    a plurality of second circuit elements having a width that is an integral multiple of the first width, the plurality of second circuit elements positioned in the plurality of rows and occupying the width of at least two of the first circuit elements.

2. An integrated circuit as in claim 1 wherein the integral multiple is two.

3. An integrated circuit as in claim 1 wherein the first and second circuit elements include both P-type and N-type transistors.

4. An integrated circuit as in claim 1 wherein the first circuit element is an inverter.

5. An integrated circuit as in claim 1 wherein the second circuit element is an inverter.

6. An integrated circuit as in claim 1 wherein the first circuit element is a flip-flop.

7. An integrated circuit comprising:
    a plurality of first standard cells having a first width, the plurality of first standard cells positioned in a plurality of rows in a semiconductor substrate; and
    a plurality of second standard cells having a width that is an integral multiple of the first width, the plurality of second standard cells positioned in the plurality of rows and spanning the width of at least two rows.

8. An integrated circuit as in claim 7 wherein the integral multiple is two.

9. An integrated circuit as in claim 7 wherein the first and second standard cells include both P-type and N-type transistors.

10. An integrated circuit as in claim 7 wherein the first standard cells is an inverter.

11. An integrated circuit as in claim 7 wherein the second standard cell is an inverter.

12. An integrated circuit as in claim 7 wherein the first standard cell is a flip-flop.

13. An integrated circuit comprising:
    at least one first circuit element having a first width, the first circuit element positioned in a plurality of rows in a semiconductor substrate, wherein the rows are divided into a first area of a first conductivity type and a second area of a second conductivity type, the first and second areas alternating in at least two adjacent rows such that the first areas of the at least two adjacent rows are positioned adjacent to each other; and
    at least one second circuit element having a second width that is at least twice the first width, the second circuit element positioned in the plurality of rows and occupying at least the width of at least two of the first circuit elements, the second circuit element spanning the at least two adjacent rows.

14. An integrated circuit as in claim 13 wherein the second width is twice the first width.

15. An integrated circuit as in claim 13 wherein the first conductivity type is P-type and the second conductivity type is N-type.

16. An integrated circuit as in claim 13 wherein the first circuit element is an inverter.

17. An integrated circuit as in claim 13 wherein the second circuit element is an inverter.

18. An integrated circuit as in claim 13 wherein the first circuit element is a flip-flop.

19. An integrated circuit comprising:
    at least one first standard cell having a first width, the first standard cell positioned in a plurality of rows in a semiconductor substrate, wherein the rows are divided into a first area of a first conductivity type and a second area of a second conductivity type, the first and second areas alternating in at least two adjacent rows such that the first areas of the at least two adjacent rows are positioned adjacent to each other; and
    at least one second standard cell having a second width that is at least twice the first width, the second standard cell positioned in the plurality of rows and occupying the width of two of the first standard cell, the second standard cell spanning the at least two adjacent rows.

20. An integrated circuit as in claim 19 wherein the second width is twice the first width.

21. An integrated circuit as in claim 19 wherein the first conductivity type is P-type and the second conductivity type is N-type.

22. An integrated circuit as in claim 19 wherein the first standard cell is an inverter.

23. An integrated circuit as in claim 19 wherein the second standard cell is an inverter.

24. An integrated circuit as in claim 19 wherein the first standard cell is a flip-flop.

* * * * *